(12) United States Patent
Hsieh et al.

(10) Patent No.: US 10,147,786 B2
(45) Date of Patent: Dec. 4, 2018

(54) POWER SEMICONDUCTOR DEVICE WITH CHARGE BALANCE DESIGN

(71) Applicant: Infineon Technologies AG, Neubiberg (DE)

(72) Inventors: Alice Pei-Shan Hsieh, Unterhaching (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/910,510

(22) Filed: Mar. 2, 2018

(65) Prior Publication Data

US 2018/0197948 A1   Jul. 12, 2018

Related U.S. Application Data

(63) Continuation of application No. 15/161,666, filed on May 23, 2016.

(51) Int. Cl.

| | |
|---|---|
| *H01L 29/15* | (2006.01) |
| *H01L 29/06* | (2006.01) |
| *H01L 21/04* | (2006.01) |
| *H01L 29/10* | (2006.01) |
| *H01L 29/16* | (2006.01) |
| *H01L 29/739* | (2006.01) |
| *H01L 29/66* | (2006.01) |

(52) U.S. Cl.
CPC ...... *H01L 29/0634* (2013.01); *H01L 21/0465* (2013.01); *H01L 29/0638* (2013.01); *H01L 29/1095* (2013.01); *H01L 29/1608* (2013.01); *H01L 29/66348* (2013.01); *H01L 29/7397* (2013.01); *H01L 29/66068* (2013.01)

(58) Field of Classification Search
None
See application file for complete search history.

(56) References Cited

U.S. PATENT DOCUMENTS

| | | |
|---|---|---|
| 5,471,075 A | 11/1995 | Shekar et al. |
| 2006/0170037 A1 | 8/2006 | Yamauchi et al. |

(Continued)

OTHER PUBLICATIONS

Antoniou, M et al., "Robustness of SuperJunction Structures Against Cosmic Ray Induced Breakdown", Solid-State Electronics, vol. 54, Issue 4, Apr. 2010, pp. 385-391.

(Continued)

*Primary Examiner* — Cory Eskridge
(74) *Attorney, Agent, or Firm* — Murphy, Bilak & Homiller, PLLC

(57) ABSTRACT

A semiconductor body having first and second vertically spaced apart surfaces is formed. A gate trench that vertically extends from the first surface of the semiconductor body towards the second surface is formed. A gate electrode and a gate dielectric are formed in the gate trench. The gate dielectric electrically insulates the gate electrode from adjacent semiconductor material. A doped superjunction region vertically extending from a bottom of the gate trench towards the second surface of the semiconductor body is formed. The doped superjunction region includes first, second, and third doped pillars vertically extending from the first surface of the first semiconductor layer and directly adjoining one another. The second pillar is laterally centered between the first and third pillars and has an opposite conductivity type as the first and third pillars.

9 Claims, 17 Drawing Sheets

(56) References Cited

U.S. PATENT DOCUMENTS

2008/0315363 A1 12/2008 Chiola et al.
2010/0264488 A1 10/2010 Hsieh
2016/0260823 A1 9/2016 Udrea et al.

OTHER PUBLICATIONS

Antoniou, M et al., "The 3.3kV Semi-SuperJunction IGBT for Increased Cosmic Ray Induced Breakdown Immunity", Proceedings of IEEE International Symposium on Power Semiconductors and IC's, Jun. 2009.

Antoniou, M et al., "The Semi-Superjunction IGBT", IEEE EDL, vol. 31, No. 6, Jun. 2010, pp. 591-593.

Antoniou, M et al., "The SuperJunction Insulated Gate Bipolar Transistor Optimization and Modeling", IEEE Transactions on Electron Devices, vol. 57, No. 3, Mar. 2010, pp. 594-600.

Hsieh, Alice P. et al., "Field-stop Layer Optimization for 1200V FS IGBT Operating at 200° C.", Proceedings of IEEE 26th International Symposium on Power Semiconductors and IC's 2014, Jun. 2014, pp. 115-118.

Hsieh, Alice P., "Superjunction IGBT vs. FS IGBT for 200° C. Operation", Proceedings of IEEE 27th International Symposium on Power Semiconductors and IC's 2015, May 2015, pp. 137-140.

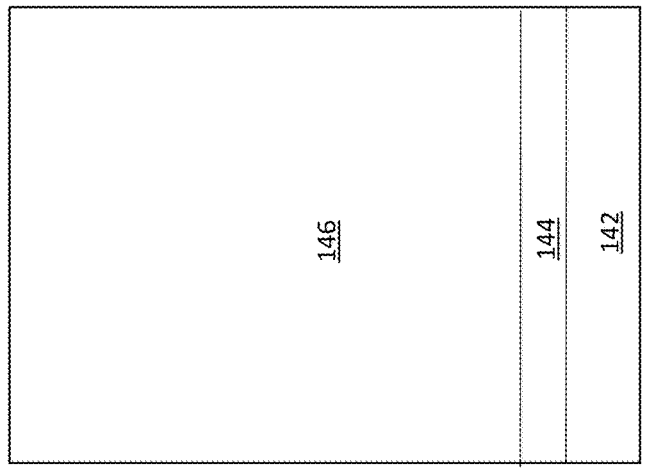
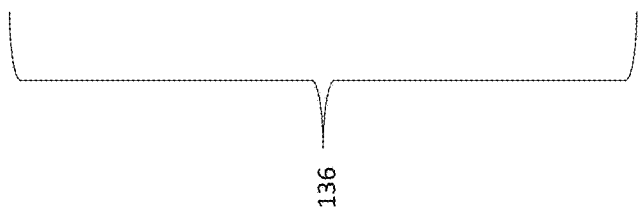
FIG. 2B
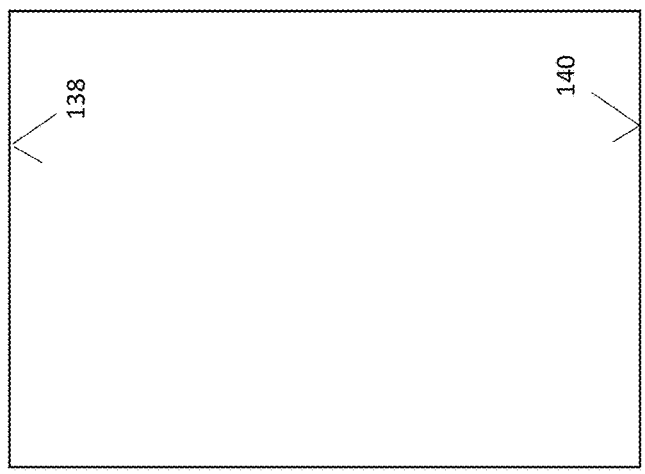
FIG. 2A
FIGURE 2

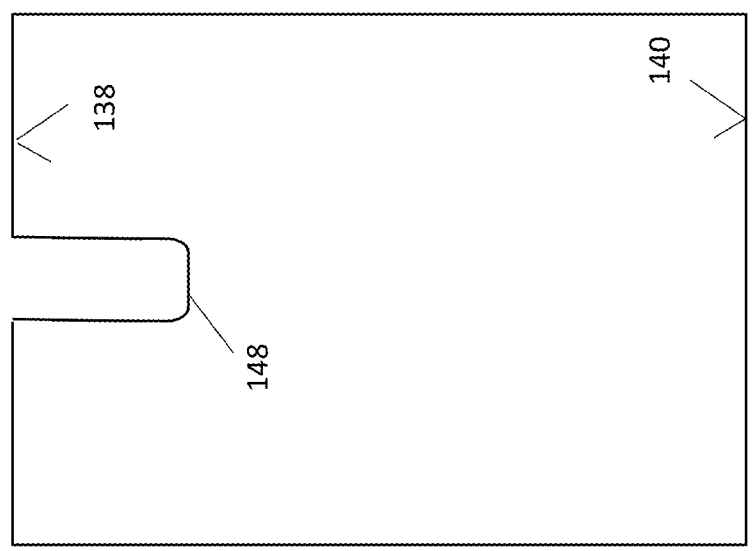
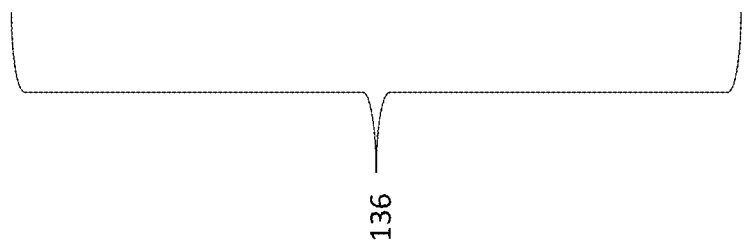
FIGURE 3

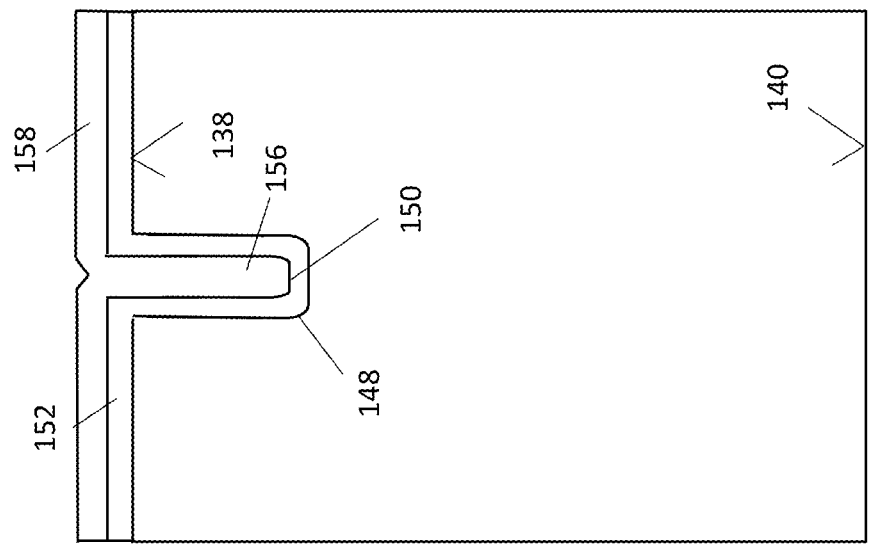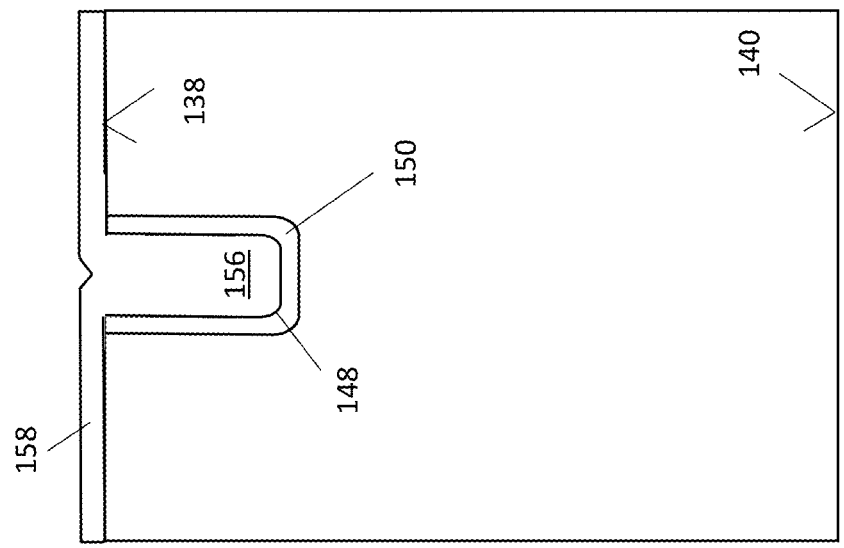
FIGURE 6

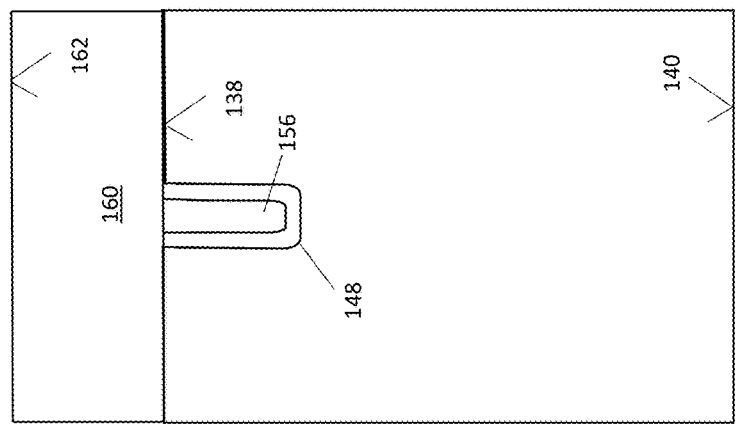
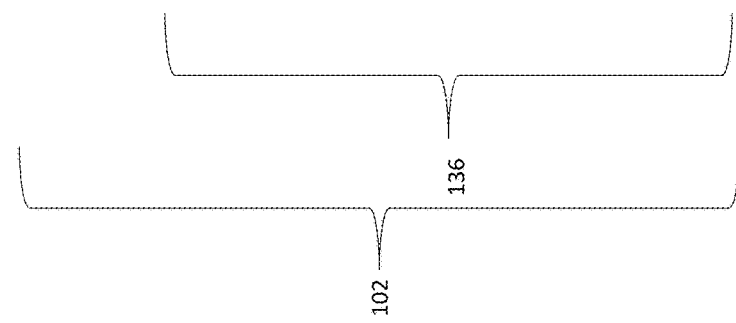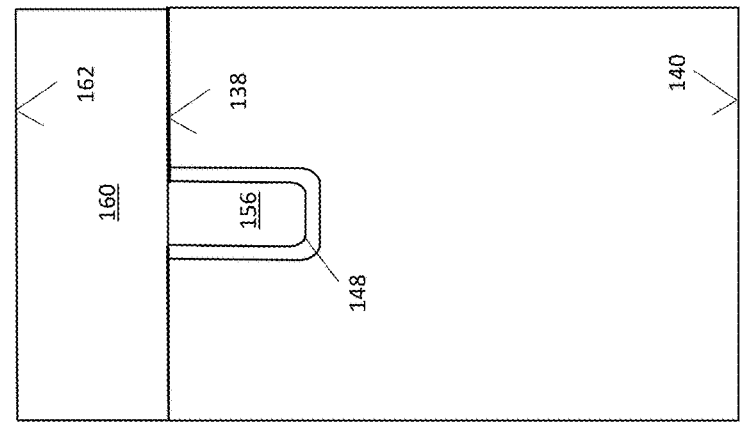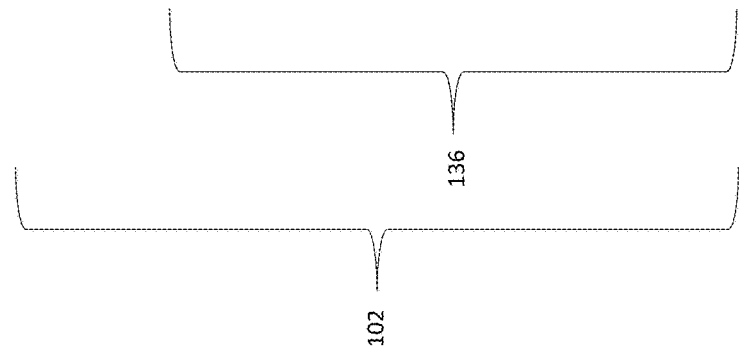
FIGURE 7

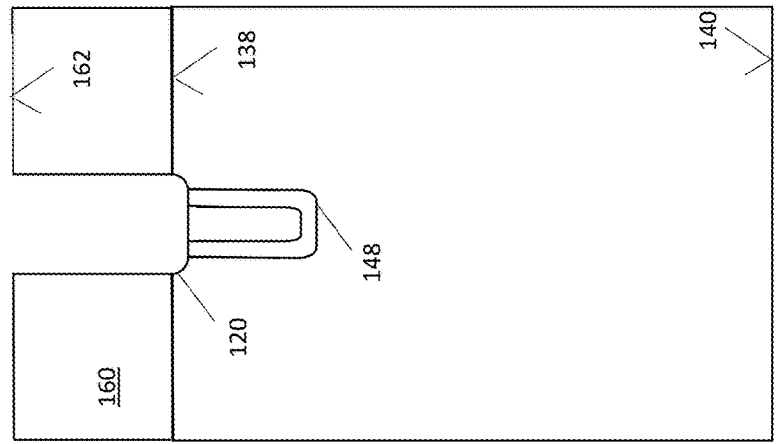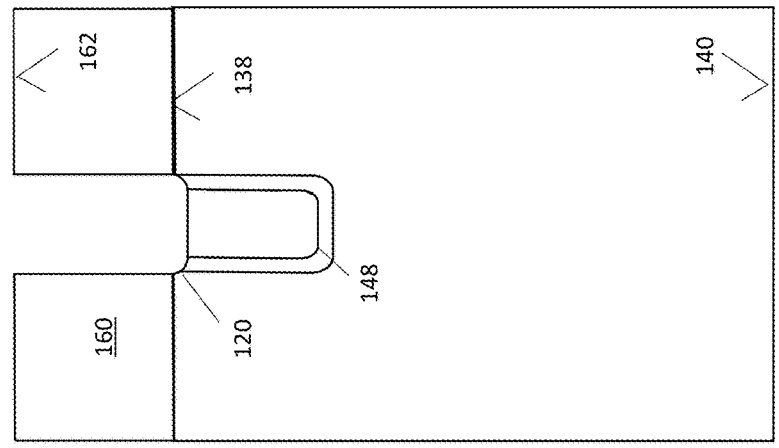
FIGURE 8

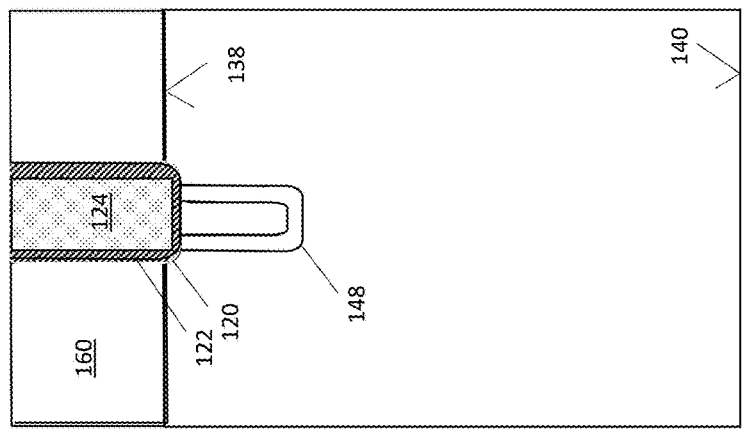
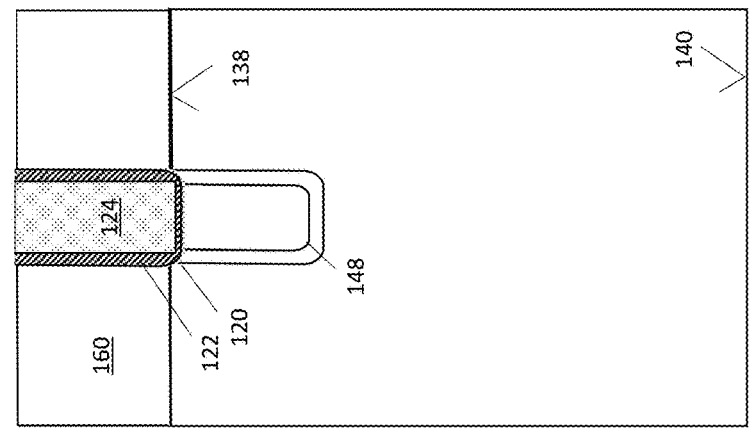
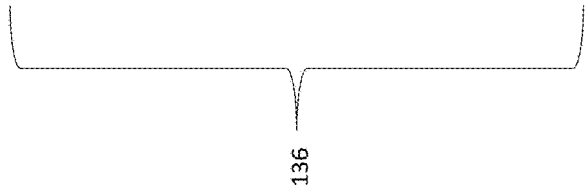
FIGURE 9

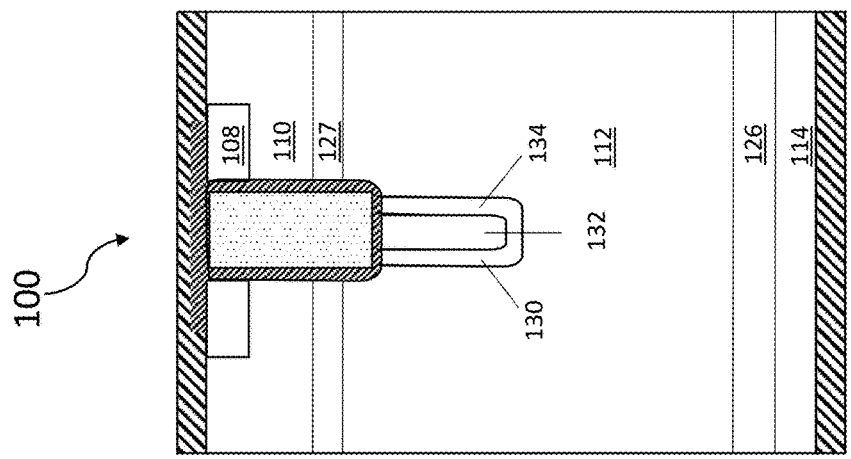
FIG. 10B
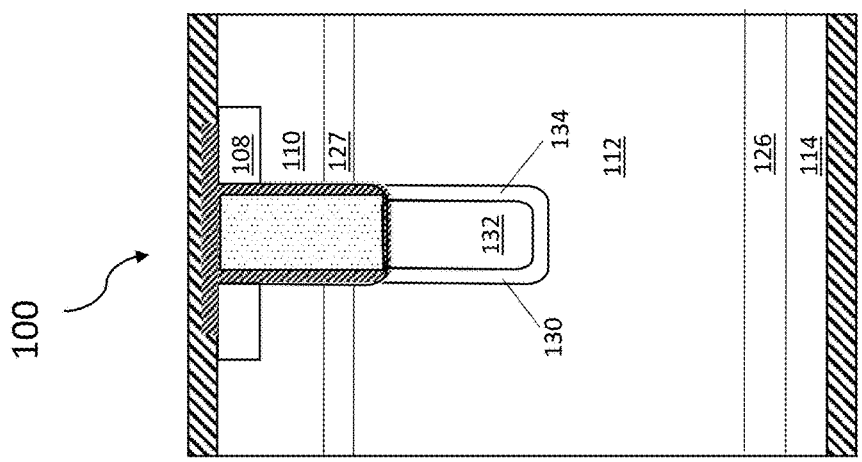
FIG. 10A
FIGURE 10

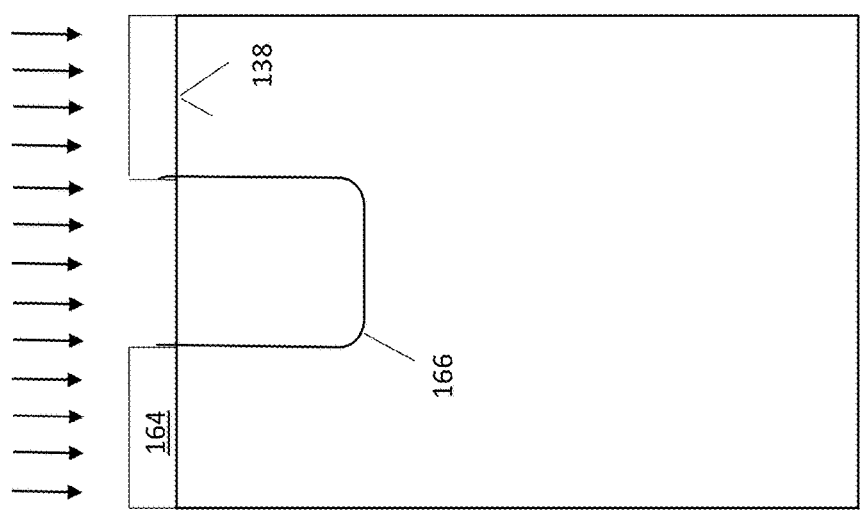
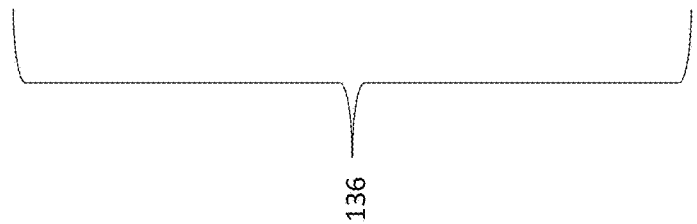
FIGURE 11

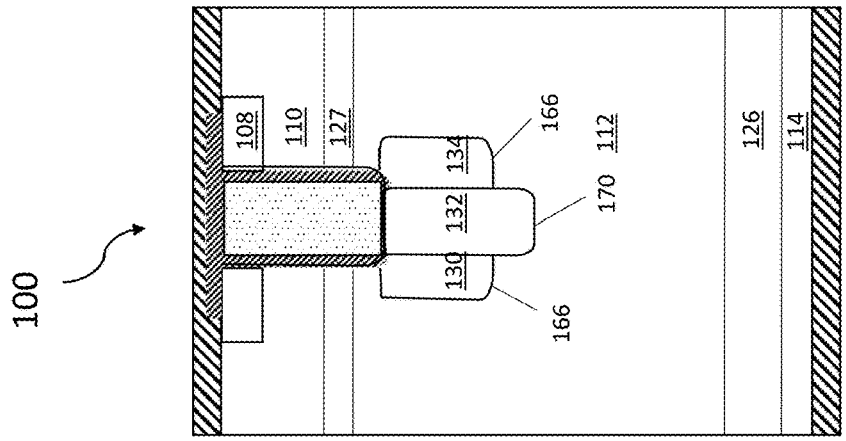
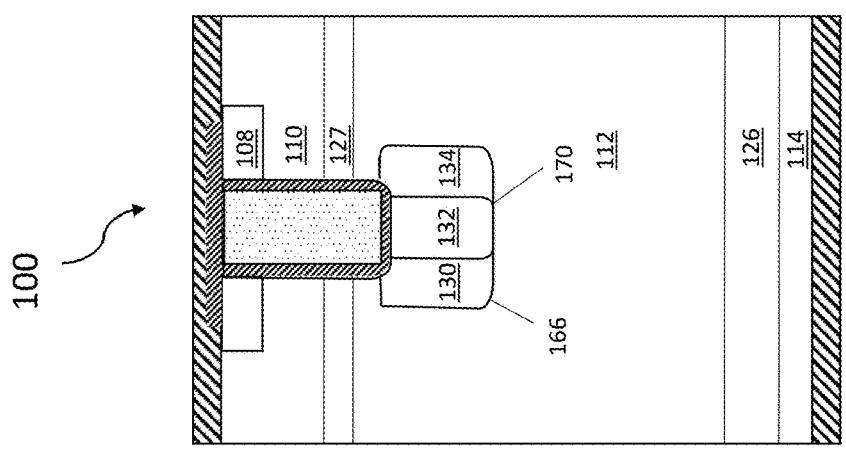
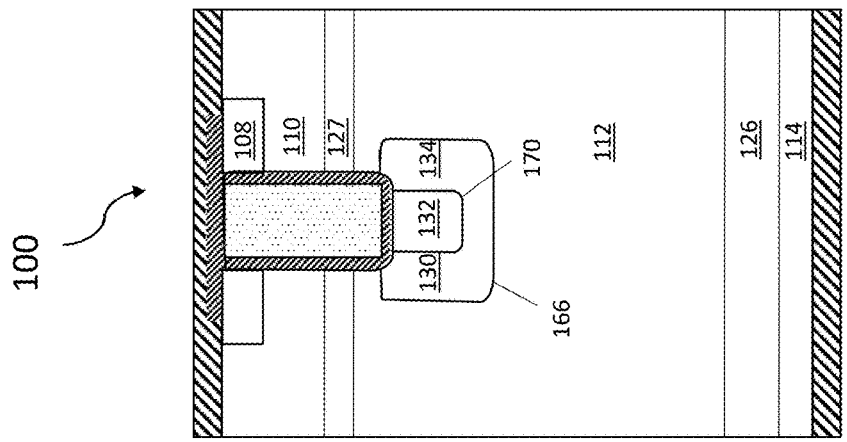
FIGURE 13

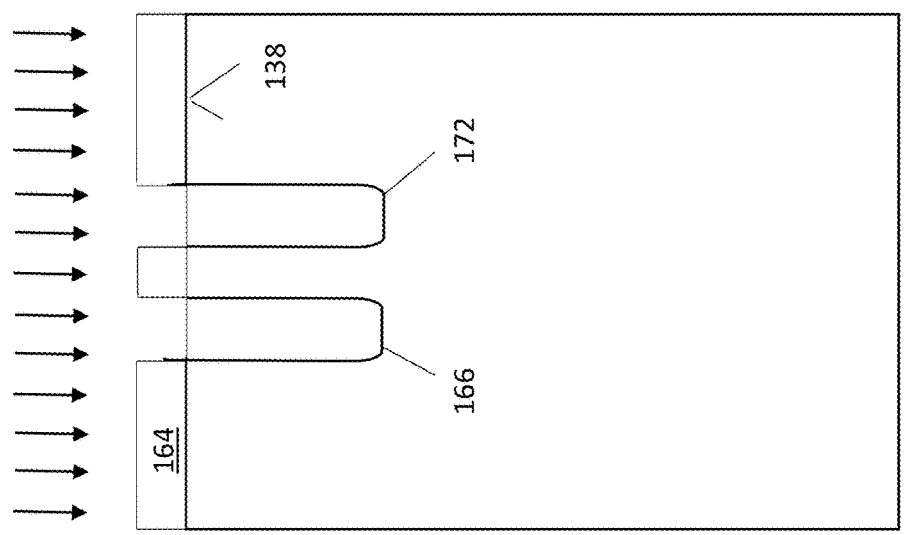
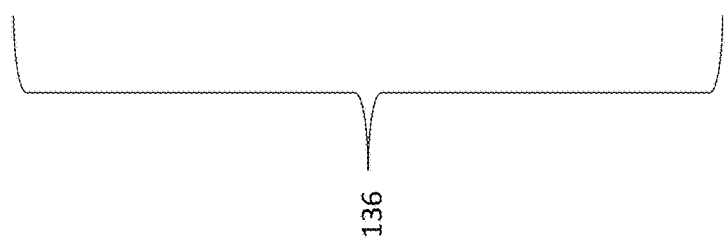
FIGURE 14

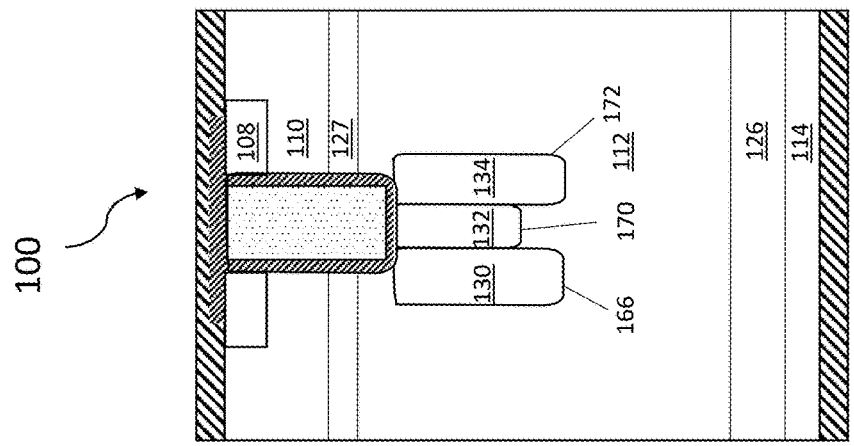
FIG. 16A
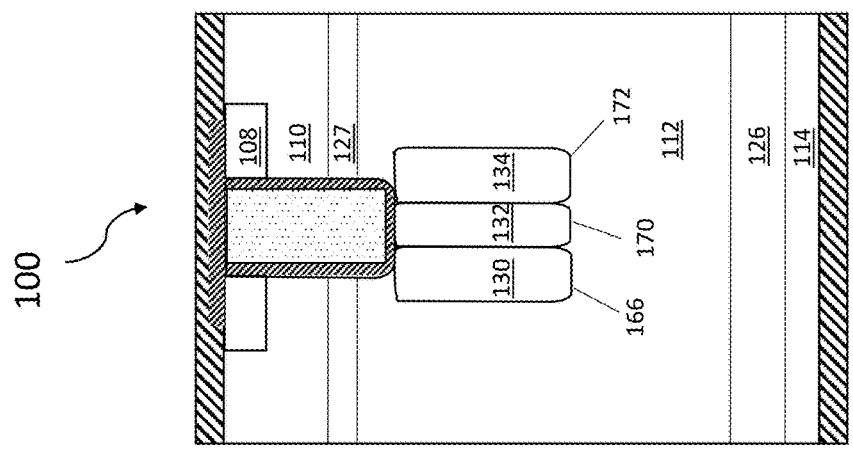
FIG. 16B
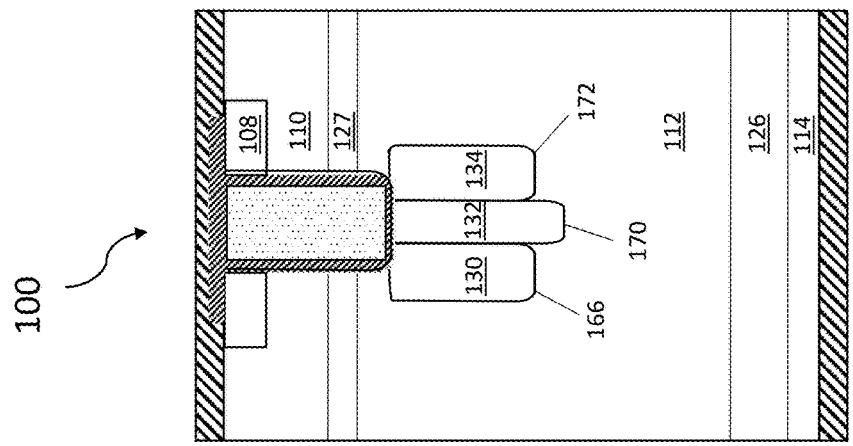
FIG. 16C
FIGURE 16

US 10,147,786 B2

POWER SEMICONDUCTOR DEVICE WITH CHARGE BALANCE DESIGN

PRIORITY CLAIM

This application is a continuation of and claims priority to U.S. patent application Ser. No. 15/161,666 filed on May 23, 2016, the content of said application incorporated herein by reference in its entirety.

TECHNICAL FIELD

The instant application relates to power semiconductor devices, and more particularly relates to drift region structures that enhance electrical performance of power semiconductor devices.

BACKGROUND

Power semiconductor devices, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, and/or high robustness are often desired. A power MOSFET typically includes a drain region, a drift region adjoining the drain region, and a source region, each having a first conductivity type, and a body region arranged between the drift region and source region of a second conductivity type. A power IGBT has a similar construction as a power MOSFET, except that the first conductivity type drain region is replaced with a second conductivity type collector region, thus forming a bipolar junction transistor with a voltage controlled switch supplying the base current of the BJT.

One issue of particular concern in power switching applications is cosmic ray radiation. Cosmic ray radiation refers to unwanted particle bombardment from the exterior environment into the operational regions of the device. Although it is more prevalent in space environments, cosmic ray radiation can occur in terrestrial environments. The particle bombardments caused by cosmic ray radiation can set off a chain reaction of impact ionization, which causes unwanted current filamentation and can lead to irreversible device failure. Devices that operate with high electric field gradients, such as power switching devices, are most vulnerable to failure from cosmic ray radiation. For this reason, many power semiconductor switching applications require the device to be ruggedized against cosmic ray radiation. Mitigating high electric fields at critical locations within the power device enables robust device performance against harsh operation conditions such as cosmic ray radiation.

Techniques used to tailor the electric field profile and peak intensity of power switching devices to improve cosmic ray robustness include (i) increasing the wafer/drift region thickness; (ii) introducing a thicker graded/diffused base material profile; (iii) reducing the n-type drift region/ intrinsic layer doping concentration; (iv) optimizing the field-stop (buffer) layer profile to reduce the peak electric field in the back side of the device; (V) using deeper p-type junctions at the surfaces to move the high electric field away from the electrodes; and (VI) thickening the gate trench oxide to alleviate the electric field strength at the trench bottom and the top side of the drift region. However, these approaches often lead to worse electrical performance trade-offs, e.g., poorer diode reverse recovery softness and higher on-state losses and hence worse $V_{ce,sat}$ (collector-emitter saturation voltage) and $E_{off}$ (turn-off loss).

SUMMARY

A method of forming a vertical trenched gate transistor is disclosed. According to an embodiment, a semiconductor body having first and second vertically spaced apart surfaces is formed. A gate trench that vertically extends from the first surface of the semiconductor body towards the second surface is formed. A gate electrode that is disposed in the gate trench is formed and a gate dielectric that is disposed in the gate trench is formed. The gate dialectic electrically insulates the gate electrode from adjacent semiconductor material. A doped superjunction region vertically extending from a bottom of the gate trench towards the second surface of the semiconductor body is formed. The doped superjunction region includes first, second, and third doped pillars vertically extending from the first surface of the first semiconductor layer and directly adjoining one another. The second pillar is laterally centered between the first and third pillars and has an opposite conductivity type as the first and third pillars.

A method of forming a vertical trenched gate transistor in a semiconductor body having first and second vertically spaced apart surfaces, the vertical trenched gate transistor having an n-type source region extending form the first surface into the semiconductor body, a p-type body region disposed beneath and adjoining the source region, an n-type drift region disposed beneath and adjoining the body region, an n-type field stop region that is more highly doped than the drift region disposed beneath and adjoining the doped n-type drift region, a gate trench extending from the first surface through the source and body regions, and a gate electrode disposed in the gate trench and being configured to control a vertical current flowing between the first and second surfaces is disclosed. According to an embodiment of the method, a doped superjunction region vertically extending from a bottom of the gate trench towards the second surface of the semiconductor body is formed. The doped superjunction region includes first, second, and third doped pillars vertically extending from the first surface of the first semiconductor layer and directly adjoining one another. The second pillar is laterally centered between the first and third pillars and has an opposite conductivity type as the first and third pillars.

A vertical trenched gate transistor that is formed in a semiconductor body having first and second vertically spaced apart surfaces is disclosed. According to an embodiment, the vertical trenched gate transistor includes an n-type source region extending form the first surface into the semiconductor body, a p-type body region disposed beneath and adjoining the source region, an n-type drift region disposed beneath and adjoining the body region, and an n-type field stop region that is more highly doped than the drift region disposed beneath and adjoining the drift region. The vertical trenched gate transistor further includes a gate trench extending from the first surface through the source and body regions, and a gate electrode and a gate dielectric in the gate trench, the gate dielectric electrically insulating the gate electrode from adjacent semiconductor material. The gate electrode is configured to control a vertical current flowing between the first and second surfaces. The vertical trenched gate transistor further includes a doped superjunction region directly adjoining and disposed beneath the gate trench. The doped superjunction region includes first, second, and third doped pillars vertically extending from a bottom of the gate trench. The second pillar is laterally centered between the first and third pillars and forms a p-n junction with the first and third pillars. A distance between a bottom of the doped superjunction region and the field stop region is greater than 50% of a vertical thickness of the drift region. The vertical thickness of the drift region is measured between the body region and the field stop region.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates first semiconductor layers that can be used to form a power semiconductor device, according to an embodiment.

FIG. 3 illustrates forming a trench in a first semiconductor layer, according to an embodiment.

FIG. 6, which includes FIGS. 6A and 6B, illustrates forming a second opposite conductivity type doped region on the first doped region using epitaxial deposition, according to an embodiment. FIG. 6A illustrates the process being applied to the device of FIG. 4. FIG. 6B illustrates the process being applied to the device of FIG. 5.

FIG. 7, which includes FIGS. 7A and 7B, illustrates epitaxially forming a second semiconductor layer that covers the first and second doped regions according to an embodiment. FIG. 7A illustrates the process being applied to the device of FIG. 6A. FIG. 7B illustrates the process being applied to the device of FIG. 6B.

FIG. 8, which includes FIGS. 8A and 8B, illustrates forming a gate trench in the second semiconductor layer. FIG. 8A illustrates the process being applied to the device of FIG. 7A. FIG. 8B illustrates the process being applied to the device of FIG. 7B.

FIG. 9, which includes FIGS. 9A and 9B, illustrates forming a gate electrode and gate dielectric in the gate trench. FIG. 9A illustrates the process being applied to the device of FIG. 8A. FIG. 9B illustrates the process being applied to the device of FIG. 8B.

FIG. 10, which includes FIGS. 10A and 10B, illustrates two different embodiments of an insulated gate bipolar transistor that may be formed according to the techniques described with reference to FIGS. 2-9, according to an embodiment.

FIG. 11 illustrates a method of forming a doped superjunction region by implanting dopant atoms into the first semiconductor layer to form a first doped well, according to an embodiment.

FIG. 13, which includes FIGS. 13A, 13B, and 13C, illustrates three different embodiments of an insulated gate bipolar transistor with a doped superjunction region that is formed according to the techniques described with reference to FIGS. 11-12, according to an embodiment.

FIG. 14 illustrates a method of forming a doped superjunction region by implanting dopant atoms into the first semiconductor layer to form first and third doped wells, according to an embodiment.

FIG. 16, which includes FIGS. 16A, 16B, and 16C, illustrates three different embodiments of an insulated gate bipolar transistor that may be formed according to the techniques described with reference to FIGS. 14-15, according to an embodiment.

DETAILED DESCRIPTION

Embodiments disclosed herein include a power semiconductor device. According to an embodiment, the power semiconductor device is an IGBT with a vertical trenched-gate electrode structure. The power semiconductor device includes a doped superjunction region that is disposed at the bottom of the gate trench and vertically extends into the drift region of the device. The doped superjunction region includes three doped pillars or stripes of alternating conductivity type (i.e., p-n-p or n-p-n). The doped superjunction region vertically extends no more than halfway into the drift region.

Various methods for forming the power semiconductor device are disclosed. Embodiments of these methods include providing a lightly doped first conductivity type first semiconductor layer. The doped superjunction region is formed in the first semiconductor layer. A variety of different techniques are disclosed for forming the doped superjunction region in the first semiconductor layer. One technique involves forming a trench in the first semiconductor layer, lining the sidewalls of the trench with first conductivity type semiconductor material, followed by filling the trench with second conductivity semiconductor material. Another technique involves performing masked ion implantations at the first surface of the first semiconductor layer to form doped wells that extend into the first semiconductor layer. These doped wells provide the first, second, and third pillars of the doped superjunction region. After the doped superjunction region is formed, a semiconductor second layer is epitaxially grown on the first semiconductor layer such that the second semiconductor layer covers the doped superjunction region. The gate trench is formed in the second semiconductor layer, with the bottom of the gate trench extending to the doped superjunction region. Active device regions, e.g., source, body, collector, emitter, etc., are formed in the second semiconductor layer.

The disclosed power semiconductor device and corresponding methods for forming the power semiconductor device have several notable advantages. For example, the structure of the doped superjunction region at the bottom of the gate trench avoids very high electric fields at the vicinity of bottom of the gate trench and thus advantageously improves the robustness of the device with respect to cosmic ray radiation. Moreover, the structure of the doped superjunction region beneficially improves the electrical performance of the device including switching losses and switching speed, while maintaining desirable breakdown voltage and on-resistance. Furthermore, the processes used to form the doped superjunction substantially less expensive, more reliable, and more controllable in comparison to prior art techniques for forming superjunction structures.

Figure 1:
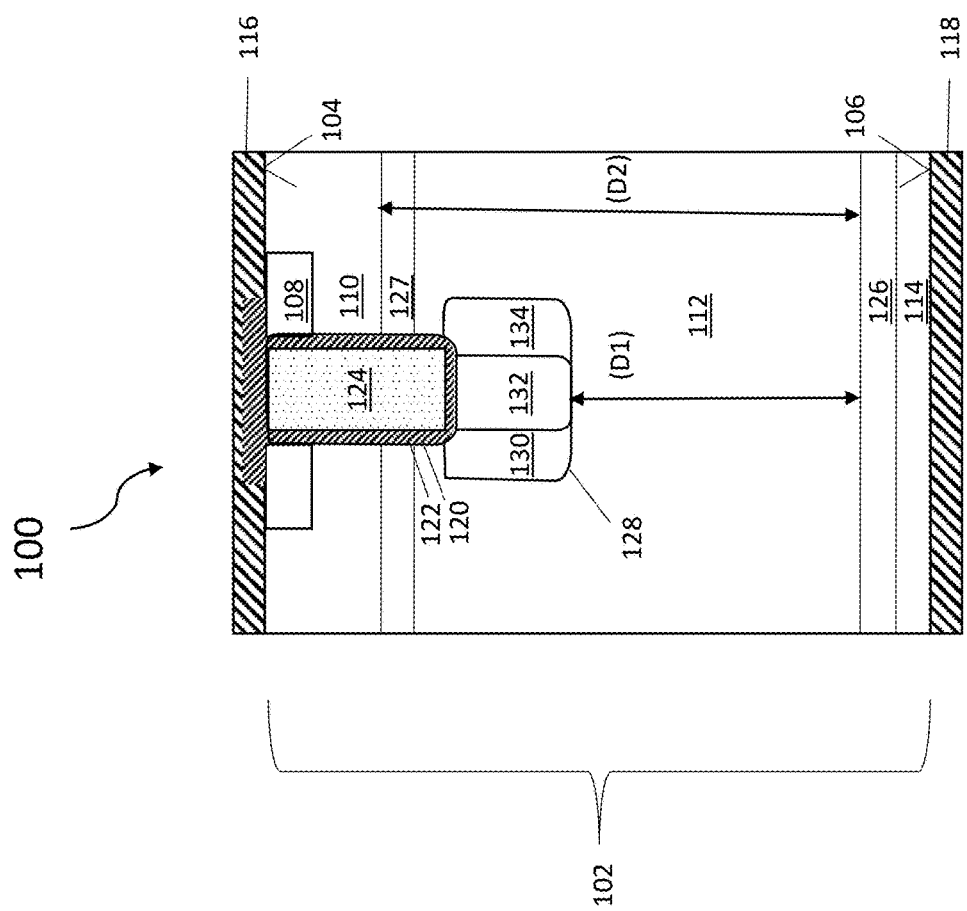
FIG. 1 illustrates an insulated gate bipolar transistor having a doped superjunction region disposed at a bottom of the gate trench, according to an embodiment.

Referring to FIG. 1, an insulated gate bipolar transistor 100 is depicted. The insulated gate bipolar transistor 100 is formed in a semiconductor body 102 that has a first surface 104 and a second surface 106 that is vertically spaced apart from the first surface 104. The insulated gate bipolar transistor 100 includes, in successive order from the first surface 104 to the second surface 106, a first conductivity type (e.g., n-type) source region 108, a second conductivity type (e.g., p-type) body region 110, a first conductivity type drift region 112, and a second conductivity type collector region 114. The majority carrier concentration of the drift region 112 can be in a range between $10^{12}$ cm$^{-3}$ and $5\times10^{14}$ cm$^{-3}$, for example, $8\times10^{13}$ cm$^{-3}$. The majority carrier concentration of the source region 108, the body region 110, and the collector region 114 can be in a range between $10^{16}$ cm$^{-3}$ and $10^{21}$ cm$^{-3}$, for example, $1\times10^{16}$ cm$^{-3}$ for the body region 110, $1\times10^{17}$ cm$^{-3}$ for the collector region 114, $1\times10^{19}$ cm$^{-3}$ for the source region 108. The source region 108 is in ohmic contact with an emitter electrode 116 that is disposed on the first surface 104 of the semiconductor body 102, and the collector region 114 is in ohmic contact with a collector electrode 118 that is disposed on the second surface 106 of the semiconductor body 102. A gate trench 120 vertically extends from the first surface 104 of the semiconductor body 102 through the source and body regions 108, 110 and into the drift region 112. A vertical length of the gate trench 120 can be in the range of 1-7 μm. An electrically conductive gate electrode 124 and an electrically insulating gate dielectric 122 are disposed in the gate trench 120. In a conventionally known manner, the insulated gate bipolar transistor 100 is configured to control a current between the emitter/source terminal and the collector terminal responsive to a voltage applied to the gate electrode 124. When the emitter and collector electrodes 116, 118 are forward biased and a voltage is applied to the gate electrode 124, a conductive channel arises in the body region 110. This conductive channel provides the base current for a vertical bipolar transistor that is formed by the body region 110, the drift region 112, and the collector region 114. In a forward blocking condition, i.e., when the emitter and collector electrodes 116, 118 are reverse biased, the p-n junction between the body region 110 and the drift region 112 becomes reverse biased and a space charge region expands across the drift region 112. At high blocking voltages, e.g., 200 V, 400 V or more, significant electric field arises in the device, and in particular near the bottom of the gate trench.

Optionally, the insulated gate bipolar transistor 100 may include a first conductivity type field stop region 126 that is more highly doped than the drift region 112, and is interposed between the drift region 112 and the collector region 114. The field stop region 126 is configured to reduce the peak electric field at the collector side of the device and thereby improve the breakdown characteristics. In the case of a short circuit condition or a cosmic ray radiation event, a high electric field may arise in the vicinity of the field-stop region 126 due to high electron current density in this region. The field stop region 126 may have a doping concentration in a range between $5\times10^{14}$ cm$^{-3}$ and $1\times10^{17}$ cm$^{-3}$. In the depicted embodiment, the field stop region 126 is disposed only at the interface with the collector region 114. Alternatively, multiple field stop regions can be vertically throughout the lower half of the drift region 112.

As a further option, the insulated gate bipolar transistor 100 may include a first conductivity type injection region 127 that is more highly doped than the drift region 112, and is interposed between the drift region 112 and the body region 110. The injection region 127 enhances on-state conduction performance by injecting majority carriers into the drift region 112. The first conductivity type injection region 127 may have a doping concentration in a range between $5\times10^{14}$ cm$^{-3}$ and $1\times10^{18}$ cm$^{-3}$.

The insulated gate bipolar transistor 100 further includes a doped superjunction region 128. The doped superjunction region 128 is disposed within the drift region 112 beneath the gate trench 120. According to an embodiment, the doped superjunction region 128 directly adjoins the bottom of the gate trench 120. The doped superjunction region 128 extends from the bottom of the gate trench 120 in a vertical direction towards the second surface 106 of the semiconductor body 102. The doped superjunction region 128 contains at least two discrete regions with a different doping type or concentration than the surrounding drift region 112. For example, these various doped regions of the many each have a majority carrier concentration in the range of $5\times10^{14}$ cm$^{-3}$ and $10^{17}$ cm$^{-3}$ According to an embodiment, the doped superjunction region 128 includes first, second and third doped pillars 130, 132, 134. The first, second and third doped pillars 130, 132, 134 can in general be formed in any shape that is elongated in the vertical direction of the semiconductor body 102. According to one embodiment, the first, second and third doped pillars 130, 132, 134 are shapes as vertical stripes. Each of these stripes may have a substantially identical width. According to other embodiments, the stripes have differing widths. According to one embodiment, the first and third doped pillars 130, 134 have a second conductivity type majority carrier concentration and the second pillar 132 has a first conductivity type majority carrier concentration. Alternatively, the first and third doped pillars 130, 134 can have the first conductivity type majority carrier concentration and the second doped pillar 132 can have the second conductivity type majority carrier concentration. Either configuration is possible, regardless of the conductivity type of the drift region 112. At least the second doped pillar 132 may directly adjoin the bottom of the gate trench 120. Optionally, all three of the first, second, and third doped pillars 130, 132, 134 may directly adjoin the bottom of the gate trench 120.

According to an embodiment, the distance (D1) between a bottom of the doped superjunction region 128 and the field stop region 126 is greater than 50% of a vertical thickness (D2) of the drift region of the device. As used herein, the vertical thickness (D2) of the drift region is measured as the shortest distance between the body region 110 and the field stop region 126 in a direction perpendicular to the first and second surfaces 104, 106 of the semiconductor body 102. In embodiments that include the injection region 127, the vertical thickness (D2) of the drift region 112 encompasses this region as well. The vertical length of the doped superjunction region 128 can vary, depending on the desired electrical attributes of the device. For example, the distance between the bottom of the doped superjunction region 128 and the field stop region 126 can be greater than 70% of a vertical thickness of the drift region 112, and can be greater than 90% of a vertical thickness of the drift region 112. The vertical length of the doped superjunction region 128 can be in the range of 1 to 20 µm, and can be 5 or 10 µm in some embodiments. The top of the doped superjunction region 128 can be spaced apart from the injection region 127 by a portion of the drift region as depicted in FIG. 1. Alternatively, the top of the doped superjunction region 128 can directly adjoin the injection region 127.

FIG. 1 shows only 1 insulated gate bipolar transistor 100 for simplicity sake. However, it is to be understood that the semiconductor body 102 can include multiple ones of the insulated gate bipolar transistor 100, with each device being configured according to one or more of the embodiments described herein. These devices can be connected together to form a single switch, or alternatively can have separate terminals and be operated independent from one another.

Selected method steps for forming various embodiments of the insulated gate bipolar transistor 100 of FIG. 1 will now be discussed with reference to FIGS. 2-16.

Referring to FIG. 2, a first semiconductor layer 136 is provided. The first semiconductor layer 136 includes first and second vertically spaced apart surfaces 138, 140. The first semiconductor layer 136 may consist of or include one or more of a variety of semiconductor materials that are used to form integrated circuit devices, such as silicon (Si), silicon carbide (SiC), germanium (Ge), a silicon germanium crystal (SiGe), gallium nitride (GaN), gallium arsenide (GaAs), and the like.

Two different embodiments for providing the first semiconductor layer 136 are depicted in FIG. 2. FIG. 2A depicts an embodiment in which the first semiconductor layer 136 is provided from a bulk wafer. The bulk wafer can be a FZ (floating zone) wafer or alternatively can be a MCZ (magnetic Czochraiski) wafer. In either case, the bulk wafer can have an intrinsic doping type and concentration corresponding to that of the drift region 112, i.e., a first conductivity type with a majority carrier concentration in the range of $10^{12}$ cm$^{-3}$ and $5\times10^{14}$ cm$^{-3}$. Referring to FIG. 2B, the first semiconductor layer 136 is a compound semiconductor layer that is formed from epitaxy. This process includes providing a bulk semiconductor substrate 142, such as a silicon or silicon carbide substrate. Subsequently, a first semiconductor region 144 (which may include a number of epitaxial layers) is epitaxially grown on the bulk semiconductor substrate 142. The first semiconductor region 144 may have a doping type and concertation corresponding to that of the field stop region 126. Subsequently, a second epitaxial region 146 (which may include a number of epitaxial layers) is grown on the first epitaxial region 144. The second epitaxial region 146 may have a doping type and concertation corresponding to that of the drift region 112, i.e. a first conductivity type with a majority carrier concentration in the range of $10^{12}$ cm$^{-3}$ and $5\times10^{14}$ cm$^{-3}$.

Referring to FIG. 3, a first trench 148 is formed in the first semiconductor layer 136. The first trench 148 is formed at the first surface 138 of the first semiconductor layer 136, and vertically extends from the first surface 138 towards the second surface 140 of the first semiconductor layer 136. The first trench 148 can be formed according to any of a variety of commonly known semiconductor processing techniques. For example, the first trench 148 can be formed by a wet or dry masked etching technique. The etching can be isotropic or anisotropic.

Figure 4:
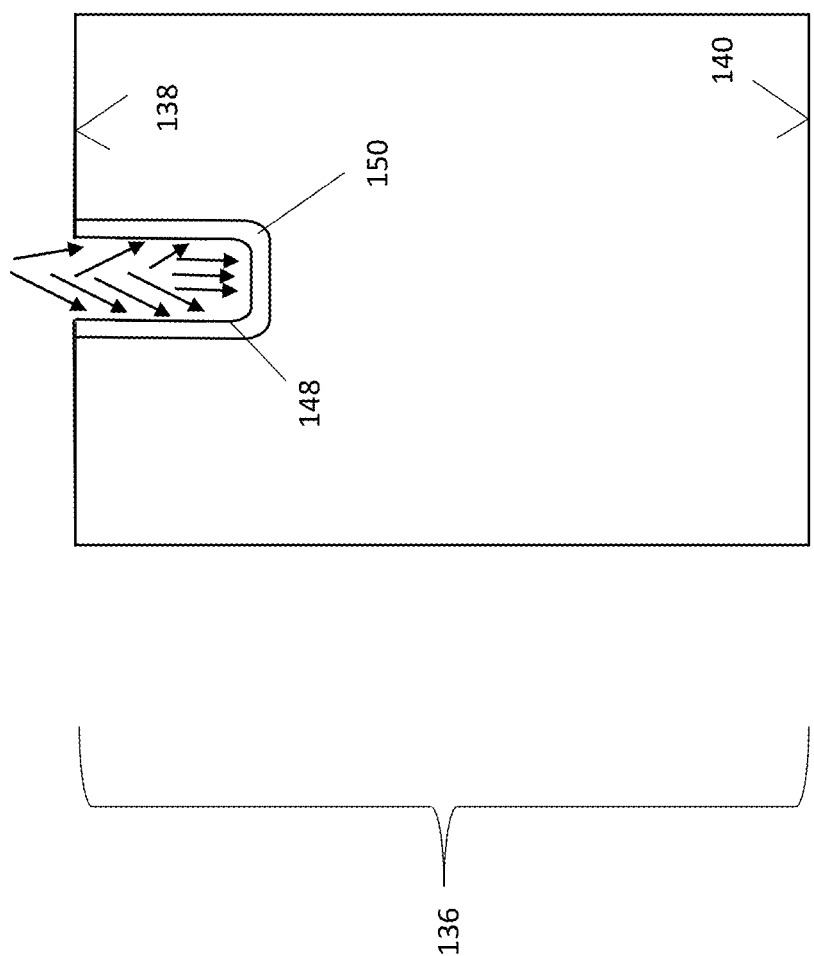
FIG. 4 illustrates forming a first doped region that lines the perimeter of the trench in the first semiconductor layer using ion implantation, according to an embodiment.

Referring to FIG. 4, a first doped semiconductor region 150 that lines a perimeter of the first trench 148 is formed, according to an embodiment. The first doped semiconductor region 150 has a majority carrier concentration of the first conductivity type. The first doped semiconductor region 150 directly adjoins the bottom and sidewalls of the first trench 148. That is, one side of the first doped semiconductor region 150 conforms to the shape of the first trench 148.

According to the technique used in FIG. 4, the first doped semiconductor region 150 is formed by implanting first conductivity type dopants from an external source into the sidewalls and bottom of the first trench 148. The implantation angle may deviate from 90 degrees such that the dopant atoms penetrate deeply into the sidewalls of the trench. As a result, the dopant atoms penetrate the bottom and sidewalls of the first trench 148 so as to form the first doped semiconductor region 150 within the first semiconductor layer 136. That is, the first doped region extends inward into the first semiconductor layer 136 from the bottom and sidewalls of the first trench 148. A mask (not shown) may be used to prevent the dopant atoms from penetrating other portions of the first semiconductor layer 136. Alternatively, the doping atoms can be incorporated into the sidewalls and the bottom of the first trench 140 by a plasma deposition technique.

Figure 5:
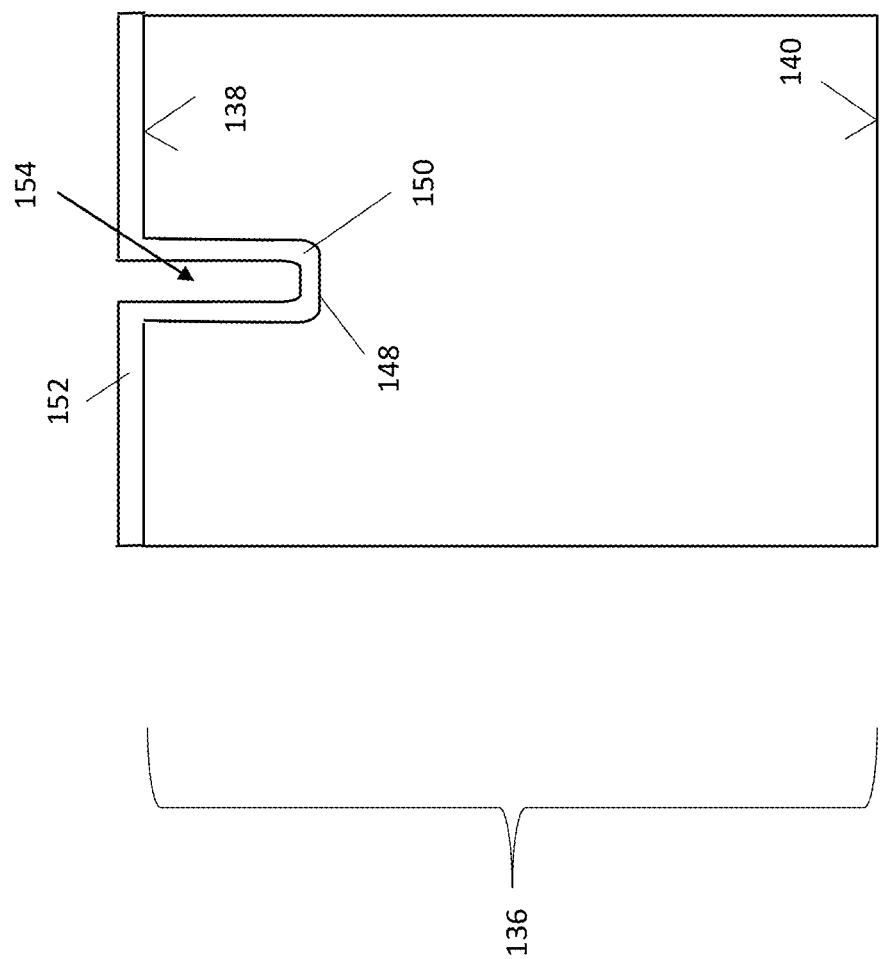
FIG. 5 illustrates forming a first doped region that lines the perimeter of the trench using epitaxial deposition, according to an embodiment.

Referring to FIG. 5, the first doped semiconductor region 150 is formed, according to another embodiment. According to this technique, the first doped semiconductor region 150 is formed by epitaxially depositing a third semiconductor layer 152 on the first semiconductor layer 136. Different to the embodiment of FIG. 4, in this embodiment, the first doped semiconductor region 150 is disposed inside of the first trench 148 and extends inward from the bottom and sidewalls of the first trench 148. The third semiconductor layer 152 is formed from the same semiconductor material as the first semiconductor layer 136, but has a higher majority carrier concentration than the first layer. The thickness of the third semiconductor layer 152 is controlled by the epitaxy process such that a void 154 remains in the first trench 148 between sections of the third semiconductor layer 152. That is, the epitaxy process is stopped before the third semiconductor layer 152 completely fills the first trench 148.

In either case of FIGS. 4 and 5, the first doped semiconductor region 150 is formed with a doping concentration corresponding to that of the first and third doped pillars 130, 134. For example, the majority carrier concentration of the first doped semiconductor region 150 may be in the range of $5\times10^{14}$ cm$^{-3}$ and $10^{17}$ cm$^{-3}$.

Referring to FIG. 6, a second doped semiconductor region 156 is formed on the first doped semiconductor region 150, according to embodiments. FIG. 6A depicts an embodiment in which the second doped semiconductor region 156 is formed on the device of FIG. 4. FIG. 6B depicts an embodiment in which the second doped semiconductor region 156 is formed on the device of FIG. 5. In either case, the second doped semiconductor region 156 is formed in the first trench 148 between the sections of the first doped semiconductor region 150 that line the sidewalls of the first trench 148. The second doped semiconductor region 156 is formed by epitaxially depositing a fourth semiconductor layer 158 of the second conductivity type. The fourth semiconductor layer 158 is epitaxially grown on exposed surfaces of the first semiconductor layer 136 in the case of FIG. 6A or the exposed surfaces of the third semiconductor layer 152 in the case of FIG. 6B. The epitaxy process is controlled such that the fourth semiconductor layer 158 is sufficiently thick to completely fill the first trench 148 in the case of FIG. 6A or to completely fill the void 154 that remains between the third semiconductor layer 152 in the case of FIG. 6B.

Referring to FIG. 7, a second semiconductor layer 160 is formed on the first surface 138 of the first semiconductor layer 136, according to embodiments. FIG. 7A depicts an embodiment in which the second semiconductor layer 160 is formed on the device of FIG. 6A. FIG. 7B depicts an embodiment in which the second semiconductor layer 160 is formed on the device of FIG. 6B. The second semiconductor layer 160 is epitaxially grown on the first surface 138 of the first semiconductor layer 136. Before forming the second semiconductor layer 160, a planarization process may be applied to the fourth and third semiconductor layers 158, 152 (in the embodiment of FIG. 6B) or the fourth semiconductor layer 158 (in the embodiment of FIG. 6A) so as to expose the first surface 138 of the first semiconductor layer 136. The second semiconductor layer 160 has the same conductivity type as the first semiconductor layer 136, and may have a similar or identical majority carrier concentration as the first semiconductor layer 136. The first and second semiconductor layers 136, 160 collectively form the semiconductor body 102 for the insulated gate bipolar transistor 100 of FIG. 1, wherein the second surface 140 of the first semiconductor layer 136 forms the second surface 106 of the semiconductor body 102 and a first surface 162 of the second semiconductor layer 160 that is opposite from the first semiconductor layer 136 forms the first surface 104 of the semiconductor body 102.

Referring to FIG. 8, the gate trench 120 is formed in the second semiconductor layer 160, according to embodiments. FIG. 8A depicts an embodiment in which the gate trench 120 is formed on the device of FIG. 7A. FIG. 8B depicts an embodiment in which the gate trench 120 is formed on the device of FIG. 7B. The gate trench 120 may be formed by a wet or dry isotropic etch technique. A mask (not shown) may be provided on the first surface 162 of the second semiconductor layer 160 and patterned in a desired geometry of which the gate trench 120. The gate trench 120 is formed in such a way that the bottom of the gate trench 120 directly adjoins the doped superjunction region 128. The processes for forming the doped superjunction region 128 and for forming the gate trench 120 are aligned such that the gate trench 120 is at least approximately laterally centered with respect to the doped superjunction region 128. The gate trench 120 may directly contact the second doped pillar 132. As shown in FIGS. 8A and 8B, the bottom of the gate trench 120 also contacts the first and third doped pillars 130, 134 of the doped superjunction region 128. However, this is not necessary, and the width of the gate trench 120, the doped superjunction region 128, and the first, second and third doped pillars 130, 132, 134 can be increased or decreased depending on user requirements or process capabilities.

Referring to FIG. 9, the gate electrode 124 and the gate dielectric 122 are formed in the gate trench 120, according to embodiments. FIG. 9A depicts an embodiment in which the gate electrode 124 and the gate dielectric 122 are formed in the device of FIG. 8A. FIG. 9B depicts an embodiment in which the gate electrode 124 and the gate dielectric 122 are formed in the device of FIG. 8B. The gate dielectric 122 may be formed by an oxidation process and the gate electrode 124 may be formed by depositing an electrically conductive material (e.g. polysilicon, aluminum, etc.) in the oxidized gate trench 120.

FIG. 10 depicts two embodiments of the insulated gate bipolar transistor 100. FIG. 10A depicts an insulated gate bipolar transistor 100 formed form the device of FIG. 9A. FIG. 10B depicts an insulated gate bipolar transistor 100 formed form the device of FIG. 9B. In either case, after the processing steps described with reference to FIG. 9 are performed, the remaining device regions of the of the insulated gate bipolar transistor 100, including the source region 108, the body region 110, the collector region 114, the field stop region 126, and the injection region 127 can be formed by conventional front end of the line doping techniques. For example, ion implantation or diffusion doping processes can be performed at the first and second surfaces 104, 106 of the semiconductor body 102 so as to form doped regions within the semiconductor body 102.

Figure 12:
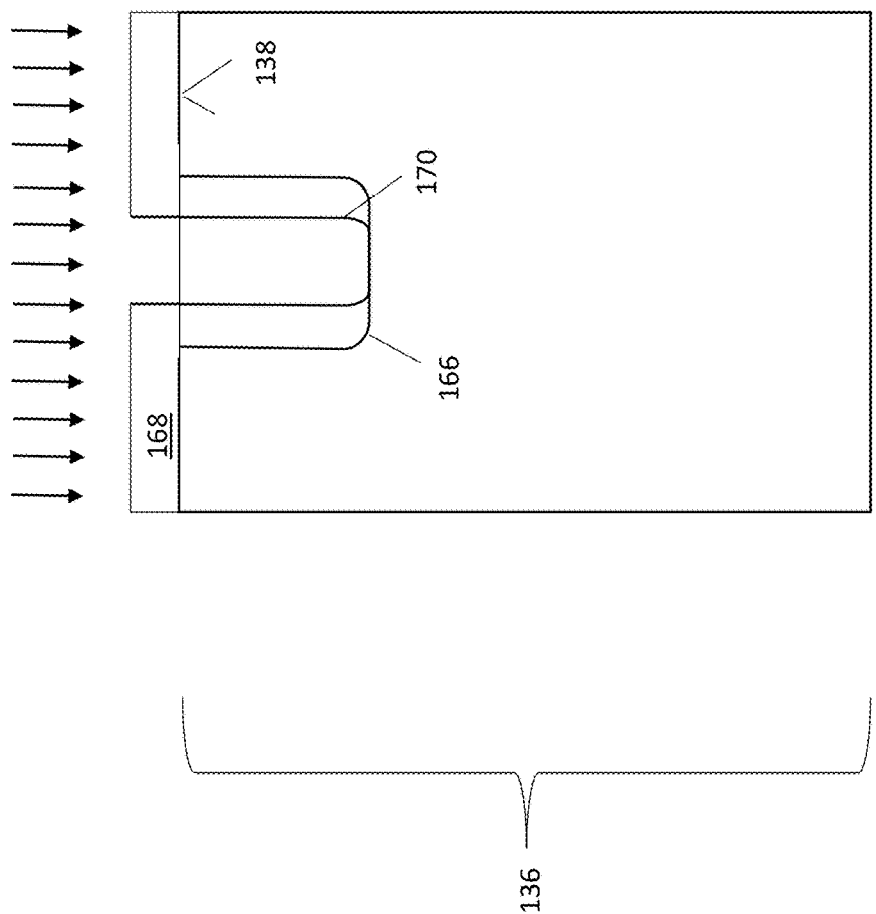
FIG. 12 illustrates implanting dopant atoms into the first semiconductor layer to form a second doped well, according to an embodiment.

Referring to FIGS. 11-12, selected method steps for forming the insulated gate bipolar transistor 100 are depicted, according to another embodiment. According to this technique, the method steps for forming the doped superjunction region 128 as described with reference to FIGS. 3-6 are replaced with the following steps. Referring to FIG. 11, the first semiconductor layer 136 as described with reference to FIG. 2 is provided. A first mask 164 is provided on the first surface 138 of the first semiconductor layer 136. The first mask 164 is pattered so as to expose a desired region of the first semiconductor layer 136. Subsequently, first conductivity type dopants are implanted into the first surface 138 of the first semiconductor layer 136. A thermal anneal may be performed to activate the dopants. As a result, a first doped well 166 that vertically extends from the first surface 138 of the first semiconductor layer 136 is formed. The first doped well 166 has a majority carrier concentration corresponding to that of the first and third doped pillars 130, 134, i.e., in the range of $5 \times 10^{14}$ cm$^{-3}$ and $10^{17}$ cm$^{-3}$.

Referring to FIG. 12, the first mask 164 has been removed and a second mask 168 has been provided on the first semiconductor layer 136. The second mask 168 is patterned with an opening that partially exposes and partially covers the first doped well 166. Subsequently, second conductivity type dopants are implanted into the first surface 138 of the first semiconductor layer 136 in a similar or identical manner as described above. As a result, a second doped well 170 that vertically extends from the first surface 138 of the first semiconductor layer 136. The second doped well 170 has a majority carrier concentration corresponding to that of the second pillar, i.e., in the range of $5 \times 10^{14}$ cm$^{-3}$ and $10^{17}$ cm$^{-3}$. The first doped well 166 is wider than the second doped well 170 and the second doped well 170 is arranged in a lateral center of the first doped well 166. As a result, portions of the first doped well 166 are disposed on both lateral sides of the second doped well 170. These portions form the first and third doped pillars 130, 134 of the doped superjunction region 128, respectively. Likewise, the second doped well 170 forms the second doped pillar 132 of the doped superjunction region 128. The width and position of the first, second and third doped pillars 130, 132, 134 may therefore be controlled by adjusting the process parameters of the doping steps described with reference to FIGS. 11 and 12. To form high aspect ratio (i.e., large depth in relation to width) first, second, and third doped pillars 130, 132, 134, it is possible to use the so-called channeling effect, which utilizes high-energy implant using a very small implant angle, e.g., less than 0.15%. Instead of the two step masking process as described with reference to FIGS. 11 and 12, it is possible to use a single mask to form both of the first and second doped wells 166, 170. This can be done by using dopant atoms with different diffusion coefficients, such as Boron (B), Arsenic (As) or Antimony (Sb).

FIG. 13 depicts three embodiments of an insulated gate bipolar transistor 100 having a doped superjunction that is formed according to the techniques described with reference to FIGS. 11-12. After performing the method steps described with reference to FIGS. 11-12 and removing any remaining mask, the second semiconductor layer 160 can be epitaxially grown on the first semiconductor layer 136, e.g., in the manner described with reference to FIG. 7. A gate trench 120 can be etched in the second semiconductor layer 160, followed by the formation of the gate electrode 124 and the gate dielectric 122 in the gate trench 120, e.g., in the manner described with reference to FIGS. 8-9. The remaining device regions of the insulated gate bipolar transistor 100 including the source region 108, the body region 110, the collector region 114, the field stop region 126, and the injection region 127 can be formed by conventionally known techniques.

In the embodiment of FIG. 13A, the second doped pillar 132 does not vertically extend as deep into the first semiconductor layer 136 as the first and third doped pillars 130, 134. In the embodiment of FIG. 13B, the second doped pillar 132 vertically extends approximately as deep into the first semiconductor layer 136 as the first and third doped pillars. In the embodiment of FIG. 13C, the second doped pillar 132 vertically extends further into the first semiconductor layer 136 as the first and third doped pillars 130, 134. The different vertical lengths of the first and second doped wells 166, 170 can be achieved by varying the implantation energy of the dopant atoms and/or selecting dopant atoms with different diffusion coefficients.

Figure 15:
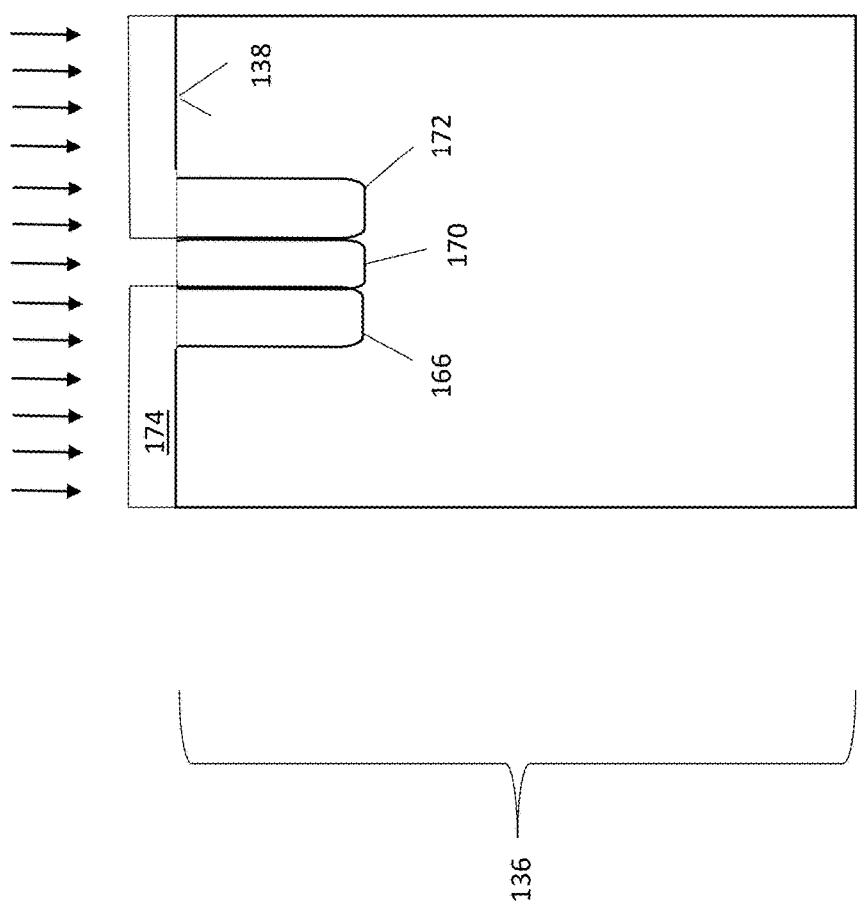
FIG. 15 illustrates implanting dopant atoms into first semiconductor layer to form a second doped well of the doped superjunction region, according to an embodiment.

Referring to FIGS. 14-15, selected method steps for forming the insulated gate bipolar transistor 100 are depicted, according to another embodiment. According to this technique, the method steps for forming the doped superjunction region 128 as described with reference to FIGS. 3-6 are replaced with the following steps. Referring to FIG. 14, the first semiconductor layer 136, as described with reference to FIG. 2, is provided. A first mask 164 is provided on the first surface of the first semiconductor layer 136. The first mask 164 is patterned with two laterally spaced openings. First conductivity type dopants are implanted into the first semiconductor layer 136 in the mask openings, activated, and in-diffused in the manner described above. As a result, first and third doped wells 166, 172 that are laterally spaced apart from one another are formed in the first semiconductor layer 136. The first and third doped wells 166, 172 have the first conductivity type and have a higher doping concentration than the adjacent portions of first semiconductor layer 136. The first and third doped wells 166, 172 have a majority carrier concentration corresponding to that of the first and third doped pillars 130, 134, i.e., in the range of $5 \times 10^{14}$ cm$^{-3}$ and $10^{17}$ cm$^{-3}$.

Referring to FIG. 15, the first mask 164 has been removed and a second mask 174 has been provided on the first semiconductor layer 136. The second mask is 174 patterned so as to expose a region of the first semiconductor layer 136 that is between the first and third doped wells 166, 172. Second conductivity type dopants are implanted into the first semiconductor layer 136 in the mask openings and activated in the manner described above. As a result, a second doped well 170 is disposed between and forms a p-n junction with the first and third doped wells 166, 172. The second doped well has a majority carrier concentration corresponding to that of the second doped pillar 132, i.e., in the range of $10^{15}$ cm$^{-3}$ and $10^{16}$ cm$^{-3}$.

FIG. 16 depicts three embodiments of an insulated gate bipolar transistor 100 having a doped superjunction that is formed according to the techniques described with reference to FIGS. 14-15. After performing these method steps, any remaining mask can be removed and the second semiconductor layer 160 can be epitaxially grown on the first semiconductor layer 136, e.g., in the manner described with reference to FIG. 7. A gate trench 120 can be etched in the second semiconductor layer 160, followed by the formation of the gate electrode 124, and the gate dielectric 122 in the gate trench 120, e.g., in the manner described with reference to FIGS. 8-9. The remaining device regions of the of the insulated gate bipolar transistor 100 including the source region 108, the body region 110, the collector region 114, the field stop region 126, and the injection region 127 can be formed by conventionally known techniques.

In the embodiment of FIG. 16A, the second doped pillar 132 does not vertically extend as deep into the first semiconductor layer 136 as the first and third doped pillars 130, 134. In the embodiment of FIG. 15B, the second doped pillar 132 vertically extends approximately as deep into the first semiconductor layer 136 as the first and third doped pillars 130, 134. In the embodiment of FIG. 15C, the second doped pillar 132 vertically extends further into the first semiconductor layer 136 as the first and third doped pillars 130, 134. These different configurations can be achieved by varying the implantation energy for forming the first, second, and third as described with reference to FIGS. 13-14.

Figure 17:
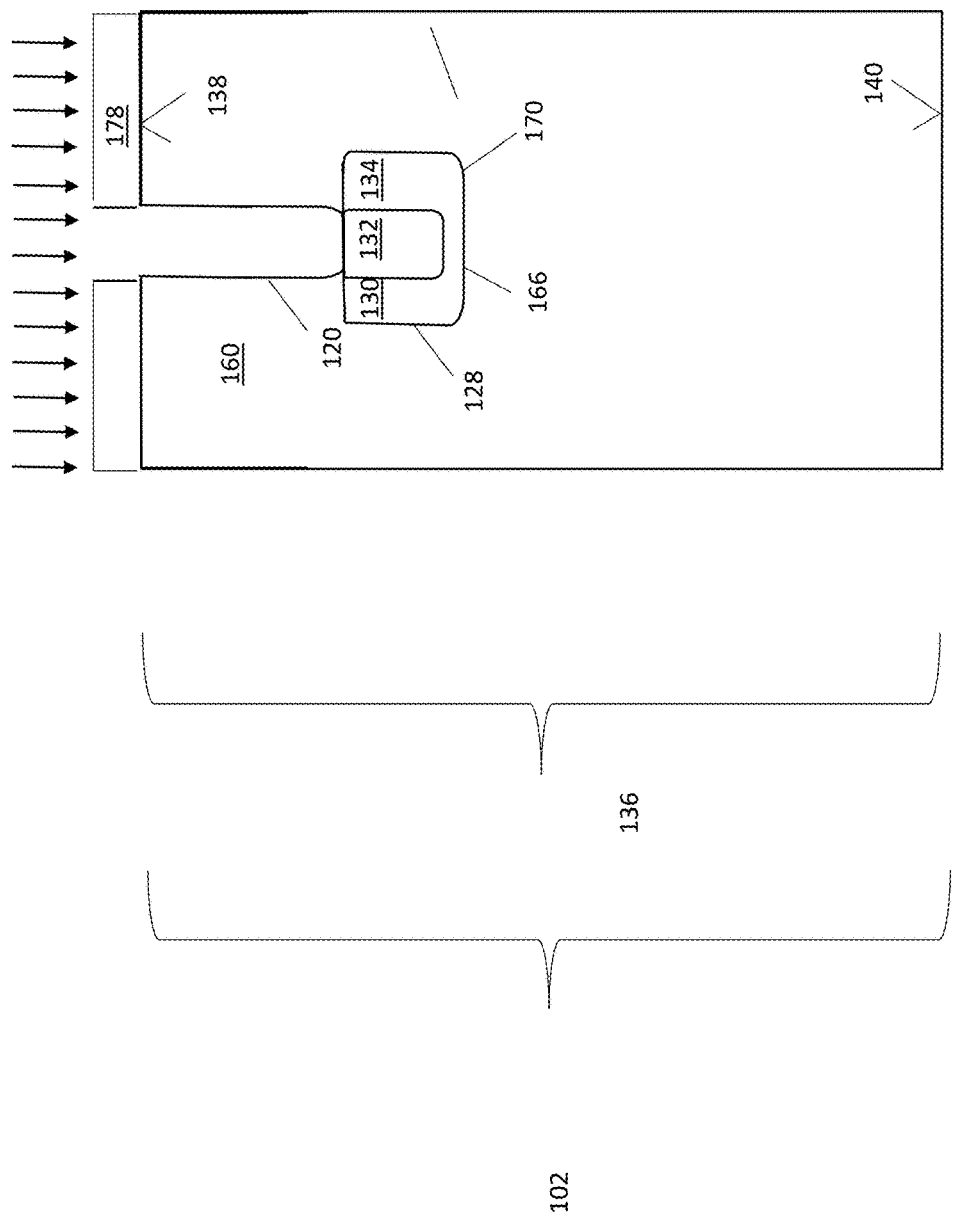
FIG. 17 illustrates a method of forming a doped superjunction region by forming a gate trench in a semiconductor body and implanting dopants into a bottom of the gate trench, according to an embodiment.

Referring to FIG. 17, selected method steps for forming the insulated gate bipolar transistor 100 are depicted, according to another embodiment. According to this technique, the method steps for forming the doped superjunction region 128 as described with reference to FIGS. 3-6 are replaced with the following steps. The first semiconductor layer 136 is provided. In this embodiment, the first semiconductor layer 136 provides the entire semiconductor body 102. That is, the step of epitaxially forming the second semiconductor layer 160 is omitted. The gate trench 120 is formed in the first surface 138 of the first semiconductor layer 136. This may be done using a wet or dry anisotropic etching technique, for example. As shown in FIG. 17, a mask 178 is formed on the first surface 138 of the first semiconductor layer 136 and is patterned in a desired geometry of the gate trench 120. Subsequently, ions are implanted into the bottom of the gate trench 120. The mask 178 prevents these ions from penetrating other regions of the semiconductor body 102. The ion implantation process includes two separate processes of implanting first conductivity type dopants and second conductivity type dopants. In this way, the first doped well 166 and the second doped well 170 as previously discussed can be formed at the bottom of the gate trench 120. The first doped well 166 can be made wider than the second doped well 170 by adjusting process parameters including dopant type, implantation energy, implantation angle, activation time, etc., as between the two ion implantation processes. The remaining device regions of the of the insulated gate bipolar transistor 100, including the source region 108, the body region 110, the collector region 114, the field stop region 126, and the injection region 127, can be formed by conventional front end of the line doping techniques.

One advantage of the technique described with reference to FIG. 17 is that it is a self-aligned technique. That is, the doped superjunction region 128 is necessarily laterally centered with respect to the gate trench 120 because the same mask 178 is used to form both the gate trench 120 and the doped superjunction region 128. This can advantageously improve yield and/or performance, as the doped superjunction region 128 is always formed in the correct area.

The inventors have discovered several advantages to the methods for forming the power semiconductor device in comparison to prior art techniques. These advantages include reduced processing cost and improved repeatability and yield in comparison to prior art techniques. Conventionally, superjunction structures for power semiconductor devices are formed from elongated p-type pillars in an n-type drift region 112 (or vice-versa). These elongated pillars are typically adjacent and laterally offset form the gate trench 120. Conventional techniques for forming these structures include a multilayer epitaxial growth process that involves the successive formation of doped regions in each epitaxial layer. Alternatively, these elongated pillars can be formed by a deep trench technique that involves the formation of high aspect ratio trenches. In either case, these processing steps are costly, time consuming and difficult to control. In particular, it is difficult to form these elongated pillars with substantially homogenous doping concentrations. Charge imbalance in these structures can detrimentally impact the blocking capability of the device. By contrast, the presently disclosed methods used to form the doped superjunction region 128 involve cost-effective and highly controllable techniques, including ion implantation, trench etching, and epitaxial growth. Many fewer epitaxial cycles are required in comparison to a multilayer epitaxial growth process. Moreover, the doping concentration of the pillars in the doped superjunction region 128 is highly uniform as a result of these techniques. In some cases, process variation may produce first, second, and third doped pillars 130, 132, 134 having varying vertical heights, e.g., as depicted in FIGS. 13 and 16. The inventors have discovered that these variations have a negligible impact on the electrical performance of the device with respect to key electrical parameters including turn-off losses, shorter delay time and shorter turn-off time. Thus, the process window for forming the doped superjunction region 128 is greatly enhanced in comparison to the prior art techniques.

Furthermore, the inventors have discovered several improvements to the electrical characteristics of the power semiconductor device in comparison to the prior art devices. These advantages include a drift region structure that produces the combined benefits of shielding the bottom of the gate trench 120 from high electric fields while simultaneously introducing compensating charges in the drift region of the device that improve the switching performance of the device. Because the doped superjunction is located at the bottom of the gate trench 120 and includes a p-n junction, an electrically insulating space charge region arises that reduces the electric field strength at the bottom of the gate trench 120 and hardens the device against failure mechanisms associated with high electric field strength, including cosmic ray radiation.

In regards to switching performance, the doped superjunction utilizes the superjunction principle to lower turn-off losses, decrease delay time and decrease turn-off time with minimal impact on on-state resistance and breakdown voltage. Generally speaking, the switching performance of a power transistor depends upon how quickly the device can remove free carriers from the drift region during turn-off so that the device can enter a blocking state. Although one can improve the switching performance by decreasing the doping concentration of the drift region, this results in an unfavorable increase to the on-state resistance of the device and higher ohmic losses. The superjunction principle beneficially shifts this tradeoff by introducing compensating charges in the drift region. By introducing compensating charges in the drift region, a space charge region will arise more quickly when the device is turned off. As a result, improved turn-off losses, shorter delay time and shorter turn-off time can be realized without compromising on-state performance.

The inventors have found in particular that the currently disclosed design of the doped superjunction region 128, which does not extend more than 50% of a vertical thickness of the drift region 112, provides favorable electrical characteristics in comparison to conventional superjunction structures. Generally speaking, it is desirable to balance charges as much as possible in the drift region of the device for rapid switching time. To this end, the conventional superjunction structures for vertical power semiconductor devices vertically extend completely, or close to completely, to the bottom of the drift region. In this way, a complete charge balance or near complete charge balance throughout the device can be achieved. However, this design may lead to very fast switching speeds, which can be problematic in some cases. For example, in certain applications, fast switching times can lead to higher voltage overshoot and enable higher switching frequency which then induces a significant amount of electromagnetic interference (EMI). Some applications place an upper limit for dV/dt (i.e., switching speed) to 5 kV/μs because anything higher can lead to reliability issues. The device described herein exhibits significant reduction in the turn-off losses without much change in the on-state voltage. Meanwhile, the switching speed (dV/dt) only marginally increases in comparison to power semiconductor devices that do not include any superjunction structures. Put another way, the limited depth doped superjunction region 128 described herein nearly approximates the beneficial characteristics of conventional superjunction structures relating to switching efficiency while avoiding the drawbacks of conventional superjunction structures associated with ultra-fast switching times.

The present specification refers to a "first" and a "second" conductivity type of dopants that semiconductor portions are doped with. The first conductivity type may be n-type and the second conductivity type may be p-type (or vice versa). As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. Insulated gate bipolar transistors can likewise be configured with a MOSFET portion that is an n-channel MOSFET or a p-channel MOSFET. Bipolar transistors can be p-n-p devices or n-p-n devices. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor.

The terms "wafer," "substrate," and "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" used in this specification intends to describe an orientation which is arranged perpendicular to the first surface of the semiconductor substrate or semiconductor body.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

The description of the embodiments is not limiting. In particular, elements of the embodiments described hereinafter may be combined with elements of different embodiments.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A vertical trenched gate transistor being formed in a semiconductor body having first and second vertically spaced apart surfaces, the vertical trenched gate transistor comprising:
    a first doped semiconductor region extending from the first surface into the semiconductor body and having a first conductivity type;
    a second doped semiconductor region disposed beneath the first doped semiconductor region and having a second conductivity type that is opposite from the first conductivity type;
    a third doped semiconductor region disposed beneath the second doped semiconductor region, the third doped semiconductor region having the first conductivity type and having a lower doping concentration than the first doped semiconductor region;
    a fourth doped semiconductor region disposed beneath the third doped semiconductor region, the fourth doped semiconductor region having the first conductivity type and having a higher doping concentration than the third doped semiconductor region;
    a gate trench extending from the first surface into the semiconductor body and through the first and second semiconductor regions, the gate trench comprising an electrically conductive gate electrode and a gate dielectric that insulates the gate electrode from the semiconductor body;
    a doped superjunction region disposed within the third doped semiconductor region beneath the gate trench, the doped superjunction region comprising first, second, and third doped pillars, the second pillar laterally centered between the first and third pillars and forming a p-n junction with the first and third pillars,
    wherein the first and third pillars are vertically separated from the second doped semiconductor region, and
    wherein the first and third pillars are laterally separated from one another by the second doped semiconductor region.

2. The vertical trenched gate transistor of claim 1, wherein upper sides of the first and third pillars are separated from the second doped semiconductor region by a portion of the third semiconductor region.

3. The vertical trenched gate transistor of claim 1, wherein the doped superjunction region directly adjoins only the gate trench or the third semiconductor region.

4. The vertical trenched gate transistor of claim 1, wherein the first, second, and third doped pillars are elongated in a vertical direction that is perpendicular to the first and second surfaces of the semiconductor body.

5. The vertical trenched gate transistor of claim 1, wherein the first doped pillar directly adjoins a first lower corner of the gate trench, and wherein the third doped pillar directly adjoins a second lower corner of the gate trench.

6. The vertical trenched gate transistor of claim 1, wherein a bottom of the second doped pillar directly adjoins the third doped region.

7. The vertical trenched gate transistor of claim 1, wherein a wherein a distance between a bottom of the doped superjunction region and the fourth doped semiconductor region is greater than 50% of a vertical thickness of the third doped semiconductor region.

8. The vertical trenched gate transistor of claim 7, wherein a wherein a distance between a bottom of the doped superjunction region and the fourth doped semiconductor region is greater than 70% of a vertical thickness of the third doped semiconductor region.

9. The vertical trenched gate transistor of claim 8, wherein a wherein a distance between a bottom of the doped superjunction region and the fourth doped semiconductor region is greater than 90% of a vertical thickness of the third doped semiconductor region.

* * * * *

UNITED STATES PATENT AND TRADEMARK OFFICE
CERTIFICATE OF CORRECTION

PATENT NO. : 10,147,786 B2
APPLICATION NO. : 15/910510
DATED : December 4, 2018
INVENTOR(S) : Hsieh et al.

Page 1 of 1

It is certified that error appears in the above-identified patent and that said Letters Patent is hereby corrected as shown below:

In the Claims

At Column 16, Line 37 (Claim 7), please delete "wherein a" before distance.

At Column 16, Line 42 (Claim 8), please delete "wherein a" before distance.

At Column 16, Line 47 (Claim 9), please delete "wherein a" before distance.

Signed and Sealed this
Nineteenth Day of February, 2019

Andrei Iancu
*Director of the United States Patent and Trademark Office*